United States Patent
Im

(10) Patent No.: US 8,569,155 B2
(45) Date of Patent: Oct. 29, 2013

(54) FLASH LAMP ANNEALING CRYSTALLIZATION FOR LARGE AREA THIN FILMS

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 225 days.

(21) Appl. No.: 12/919,681

(22) PCT Filed: Feb. 27, 2009

(86) PCT No.: PCT/US2009/035566
§ 371 (c)(1),
(2), (4) Date: Jan. 24, 2011

(87) PCT Pub. No.: WO01/73769
PCT Pub. Date: Oct. 4, 2001

(65) Prior Publication Data
US 2011/0101368 A1    May 5, 2011

Related U.S. Application Data

(60) Provisional application No. 61/032,737, filed on Feb. 29, 2008, provisional application No. 61/032,784, filed on Feb. 29, 2008.

(51) Int. Cl.
*H01L 21/425* (2006.01)
(52) U.S. Cl.
USPC ............ 438/527; 438/99; 438/151; 438/199; 438/795
(58) Field of Classification Search
USPC ............................ 438/527, 99, 151, 199, 795
See application file for complete search history.

(56) References Cited

U.S. PATENT DOCUMENTS

| | | | |
|---|---|---|---|
| 3,632,205 A | 1/1972 | Marcy et al. |
| 4,234,358 A | 11/1980 | Celler et al. |
| 4,309,225 A | 1/1982 | Fan et al. |
| 4,382,658 A | 5/1983 | Shields et al. |
| 4,456,371 A | 6/1984 | Lin |

(Continued)

FOREIGN PATENT DOCUMENTS

| | | |
|---|---|---|
| CN | 1495848 A | 5/2004 |
| CN | 101111925 A | 1/2008 |

(Continued)

OTHER PUBLICATIONS

International Search Report and Written Opinion issued for corresponding International Patent Application No. PCT/US2009/035566.

(Continued)

*Primary Examiner* — Telly Green
(74) *Attorney, Agent, or Firm* — Wilmer Cutler Pickering Hale and Dorr LLP

(57) ABSTRACT

The disclosed subject matter generally relates a method of irradiating a large area thin film with a pulsed light source. In some embodiments, the disclosed subject matter particularly relates to utilizing flash lamp annealing in combination with patterning techniques for making thin film devices. The flash lamp annealing can trigger lateral growth crystallization or explosive crystallization in large area thin films. In some embodiments, capping layers or proximity masks can be used in conjunction with the flash lamp annealing.

24 Claims, 7 Drawing Sheets

(56) References Cited

U.S. PATENT DOCUMENTS

| | | |
|---|---|---|
| 4,639,277 A | 1/1987 | Hawkins |
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai et al. |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| 5,076,667 A | 12/1991 | Stewart |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai et al. |
| 5,247,375 A | 9/1993 | Mochizuki |
| 5,281,840 A | 1/1994 | Sarma |
| 5,285,236 A | 2/1994 | Jain |
| 5,291,240 A | 3/1994 | Jain |
| 5,294,811 A | 3/1994 | Aoyama et al. |
| 5,304,357 A | 4/1994 | Sato et al. |
| 5,338,959 A | 8/1994 | Kim et al. |
| 5,373,803 A | 12/1994 | Noguchi et al. |
| 5,395,481 A | 3/1995 | McCarthy |
| 5,409,867 A | 4/1995 | Asano et al. |
| 5,453,594 A | 9/1995 | Konecny |
| 5,456,763 A | 10/1995 | Kaschmitter et al. |
| 5,496,768 A | 3/1996 | Kudo et al. |
| 5,512,494 A | 4/1996 | Tanabe et al. |
| 5,523,193 A | 6/1996 | Nelson |
| 5,529,951 A | 6/1996 | Noguchi et al. |
| 5,591,668 A | 1/1997 | Maegawa et al. |
| 5,663,579 A | 9/1997 | Noguchi |
| 5,683,935 A | 11/1997 | Miyamoto |
| 5,710,050 A | 1/1998 | Makita et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka et al. |
| 5,960,323 A | 9/1999 | Wakita et al. |
| 5,986,807 A | 11/1999 | Fork |
| 6,002,523 A | 12/1999 | Tanaka |
| 6,014,944 A | 1/2000 | Aklufi et al. |
| 6,020,244 A | 2/2000 | Thompson et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,117,752 A | 9/2000 | Suzuki et al. |
| 6,120,976 A | 9/2000 | Treadwell et al. |
| 6,130,009 A | 10/2000 | Smith et al. |
| 6,130,455 A | 10/2000 | Yoshinouchi et al. |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch et al. |
| 6,172,820 B1 | 1/2001 | Kuwahara et al. |
| 6,176,922 B1 | 1/2001 | Aklufi et al. |
| 6,177,301 B1 | 1/2001 | Jung et al. |
| 6,187,088 B1 | 2/2001 | Okumura et al. |
| 6,190,985 B1 | 2/2001 | Buynoski |
| 6,193,796 B1 | 2/2001 | Yang et al. |
| 6,203,952 B1 | 3/2001 | O'Brien et al. |
| 6,235,614 B1 | 5/2001 | Yang et al. |
| 6,242,291 B1 | 6/2001 | Kusumoto et al. |
| 6,274,488 B1 | 8/2001 | Talwar et al. |
| 6,285,001 B1 | 9/2001 | Fleming et al. |
| 6,300,175 B1 | 10/2001 | Moon et al. |
| 6,313,435 B1 | 11/2001 | Shoemaker et al. |
| 6,316,338 B1 | 11/2001 | Jung et al. |
| 6,320,227 B1 | 11/2001 | Lee et al. |
| 6,322,625 B2 | 11/2001 | Im |
| 6,326,186 B1 | 12/2001 | Kirk et al. |
| 6,326,215 B1 | 12/2001 | Keen |
| 6,326,286 B1 | 12/2001 | Park et al. |
| 6,333,232 B1 | 12/2001 | Kunikiyo et al. |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka et al. |
| 6,393,042 B1 | 5/2002 | Tanaka et al. |
| 6,407,012 B1 | 6/2002 | Miyasaka et al. |
| 6,410,373 B1 | 6/2002 | Chang et al. |
| 6,429,100 B2 | 8/2002 | Yoneda et al. |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,479,837 B1 | 11/2002 | Ogawa et al. |
| 6,482,722 B2 | 11/2002 | Kunii et al. |
| 6,493,042 B1 | 12/2002 | Bozdagi et al. |
| 6,495,067 B1 | 12/2002 | Ono et al. |
| 6,495,405 B2 | 12/2002 | Voutsas et al. |
| 6,501,095 B2 | 12/2002 | Yamaguchi et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka et al. |
| 6,516,009 B1 | 2/2003 | Tanaka et al. |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,422 B1 | 4/2003 | Yamazaki et al. |
| 6,555,449 B1 | 4/2003 | Im et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,741,621 B2 | 5/2004 | Asano |
| 6,750,424 B2 | 6/2004 | Tanaka |
| 6,755,909 B2 | 6/2004 | Jung |
| 6,784,455 B2 | 8/2004 | Maekawa et al. |
| 6,830,993 B1 | 12/2004 | Im et al. |
| 6,858,477 B2 | 2/2005 | Deane et al. |
| 6,908,835 B2 | 6/2005 | Sposili et al. |
| 6,916,690 B2 | 7/2005 | Chang |
| 6,961,117 B2 | 11/2005 | Im |
| 6,962,860 B2 | 11/2005 | Yamazaki et al. |
| 6,984,573 B2 | 1/2006 | Yamazaki et al. |
| 7,029,996 B2 | 4/2006 | Im et al. |
| 7,078,281 B2 | 7/2006 | Tanaka et al. |
| 7,091,411 B2 | 8/2006 | Falk et al. |
| 7,115,503 B2 | 10/2006 | Im |
| 7,119,365 B2 | 10/2006 | Takafuji et al. |

(56) References Cited

U.S. PATENT DOCUMENTS

| | | |
|---|---|---|
| 7,132,204 B2 | 11/2006 | Jung |
| 7,144,793 B2 | 12/2006 | Gosain et al. |
| 7,164,152 B2 | 1/2007 | Im |
| 7,183,229 B2 | 2/2007 | Yamanaka |
| 7,187,016 B2 | 3/2007 | Arima |
| 7,189,624 B2 | 3/2007 | Ito |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,297,982 B2 | 11/2007 | Suzuki et al. |
| 7,311,778 B2 | 12/2007 | Im et al. |
| 7,318,866 B2 | 1/2008 | Im |
| 7,323,368 B2 * | 1/2008 | Takayama et al. ............ 438/149 |
| 7,326,876 B2 | 2/2008 | Jung |
| 7,364,952 B2 | 4/2008 | Im |
| 7,399,359 B2 | 7/2008 | Im et al. |
| 7,645,337 B2 | 1/2010 | Im et al. |
| 7,700,462 B2 | 4/2010 | Tanaka et al. |
| 7,804,647 B2 | 9/2010 | Mitani et al. |
| 2001/0001745 A1 | 5/2001 | Im et al. |
| 2001/0029089 A1 | 10/2001 | Tanaka |
| 2001/0030292 A1 | 10/2001 | Brotherton |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0197778 A1 | 12/2002 | Kasahara et al. |
| 2003/0006221 A1 | 1/2003 | Hong et al. |
| 2003/0013278 A1 | 1/2003 | Jang et al. |
| 2003/0013280 A1 | 1/2003 | Yamanaka |
| 2003/0022471 A1 | 1/2003 | Taketomi et al. |
| 2003/0029212 A1 | 2/2003 | Im |
| 2003/0057418 A1 | 3/2003 | Asano |
| 2003/0060026 A1 | 3/2003 | Yamazaki et al. |
| 2003/0068836 A1 | 4/2003 | Hongo et al. |
| 2003/0088848 A1 | 5/2003 | Crowder |
| 2003/0096489 A1 | 5/2003 | Im et al. |
| 2003/0104682 A1 | 6/2003 | Hara |
| 2003/0119286 A1 | 6/2003 | Im et al. |
| 2003/0148565 A1 | 8/2003 | Yamanaka |
| 2003/0148594 A1 | 8/2003 | Yamazaki et al. |
| 2003/0183270 A1 | 10/2003 | Falk et al. |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0209447 A1 | 10/2004 | Gosain et al. |
| 2004/0222187 A1 | 11/2004 | Lin |
| 2004/0224487 A1 | 11/2004 | Yang |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0059222 A1 | 3/2005 | You |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im et al. |
| 2005/0255640 A1 | 11/2005 | Im et al. |
| 2006/0030164 A1 | 2/2006 | Im |
| 2006/0035478 A1 | 2/2006 | You |
| 2006/0040512 A1 | 2/2006 | Im |
| 2006/0060130 A1 | 3/2006 | Im |
| 2006/0102901 A1 | 5/2006 | Im et al. |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im et al. |
| 2007/0012664 A1 | 1/2007 | Im |
| 2007/0020942 A1 | 1/2007 | Im |
| 2007/0032096 A1 | 2/2007 | Im |
| 2007/0051302 A1 | 3/2007 | Gosain et al. |
| 2007/0054477 A1 | 3/2007 | Kim et al. |
| 2007/0108472 A1 | 5/2007 | Jeong et al. |
| 2007/0111349 A1 | 5/2007 | Im |
| 2007/0145017 A1 | 6/2007 | Im et al. |
| 2007/0184638 A1 | 8/2007 | Kang et al. |
| 2007/0215877 A1 | 9/2007 | Kato et al. |
| 2008/0035863 A1 | 2/2008 | Im et al. |
| 2008/0124526 A1 | 5/2008 | Im |
| 2008/0176414 A1 | 7/2008 | Im |
| 2009/0137105 A1 | 5/2009 | Im |
| 2009/0242805 A1 | 10/2009 | Im |
| 2009/0309104 A1 | 12/2009 | Im et al. |
| 2010/0024865 A1 | 2/2010 | Shah et al. |

FOREIGN PATENT DOCUMENTS

| | | |
|---|---|---|
| DE | 19839718 | 3/2000 |
| DE | 10103670 | 8/2002 |
| EP | 655774 A2 | 5/1995 |
| EP | 681316 A2 | 11/1995 |
| EP | 1067593 A2 | 1/2001 |
| GB | 2338342 A | 12/1999 |
| GB | 2338343 A | 12/1999 |
| GB | 2338597 A | 12/1999 |
| JP | S57-027035 | 2/1982 |
| JP | 62160781 | 7/1987 |
| JP | 62181419 A | 8/1987 |
| JP | 62216320 | 9/1987 |
| JP | H01-256114 | 10/1989 |
| JP | 2081422 | 3/1990 |
| JP | 2283036 A | 11/1990 |
| JP | 04033327 A | 2/1992 |
| JP | 04279064 | 10/1992 |
| JP | 5041519 A | 2/1993 |
| JP | 5048190 | 2/1993 |
| JP | 06-011729 | 1/1994 |
| JP | 6252048 A | 9/1994 |
| JP | H06-260502 | 9/1994 |
| JP | 6283422 A | 10/1994 |
| JP | 7176757 A | 7/1995 |
| JP | H08-078330 | 3/1996 |
| JP | H09-007968 | 1/1997 |
| JP | 9171971 A | 6/1997 |
| JP | H09-270393 | 9/1997 |
| JP | 9260681 A | 10/1997 |
| JP | 9321210 A | 12/1997 |
| JP | 10189998 | 7/1998 |
| JP | H10-244390 | 9/1998 |
| JP | 11025064 A | 1/1999 |
| JP | 11064883 A | 3/1999 |
| JP | 11281997 | 10/1999 |
| JP | H11-297852 | 10/1999 |
| JP | 11330000 A | 11/1999 |
| JP | 2000505241 A | 4/2000 |
| JP | 2000-315652 | 11/2000 |
| JP | 2000346618 | 12/2000 |
| JP | 2001023920 A | 1/2001 |
| JP | 2000223425 | 8/2002 |
| JP | 2002-353142 | 12/2002 |
| JP | 2002353159 A | 12/2002 |
| JP | 2003-031496 | 1/2003 |
| JP | 2004031809 | 1/2003 |
| JP | 2003-509844 | 3/2003 |
| JP | 20003100653 | 4/2003 |
| JP | 2004-311935 | 11/2004 |
| TW | 457553 B | 10/2001 |
| TW | 464960 A1 | 11/2001 |

(56) References Cited

FOREIGN PATENT DOCUMENTS

| TW | 564465 A | 12/2003 |
|---|---|---|
| TW | 569350 B | 1/2004 |
| WO | WO-9745827 | 12/1997 |
| WO | WO-9824118 | 6/1998 |
| WO | WO-9931719 | 6/1999 |
| WO | WO-0014784 | 3/2000 |
| WO | WO-0118854 | 3/2001 |
| WO | WO-0118855 | 3/2001 |
| WO | WO-0171786 | 9/2001 |
| WO | WO-0171791 | 9/2001 |
| WO | WO-01/73769 A1 | 10/2001 |
| WO | WO-0231869 A2 | 4/2002 |
| WO | WO-0242847 | 5/2002 |
| WO | WO-02086954 A1 | 10/2002 |
| WO | WO-02086955 | 10/2002 |
| WO | WO-03018882 A1 | 3/2003 |
| WO | WO-03046965 | 6/2003 |
| WO | WO-03084688 | 10/2003 |
| WO | WO-2004017379 A2 | 2/2004 |
| WO | WO-2004017380 A2 | 2/2004 |
| WO | WO-2004017381 | 2/2004 |
| WO | WO-2004017382 A2 | 2/2004 |
| WO | WO-2004075263 A2 | 9/2004 |
| WO | WO-2005/029551 | 3/2005 |
| WO | WO-2005029546 A2 | 3/2005 |
| WO | WO-2005029548 A2 | 3/2005 |
| WO | WO-2005029550 A2 | 3/2005 |
| WO | WO-2006/055003 A1 | 5/2006 |

OTHER PUBLICATIONS

Bergmann, R. et al., Nucleation and Growth of Crystalline Silicon Films on Glass for Solar Cells, Phys. Stat. Sol., 1998, pp. 587-602, vol. 166, Germany.

Biegelsen, D.K., L.E. Fennell and J.C. Zesch, Origin of oriented crystal growth of radiantly melted silicon on SiO/sub 2, Appl. Phys. Lett. 45, 546 (1984).

Boyd, I. W., "Laser Processing of Thin Films and Microstructures, Oxidation, Deposition and Etching of Insulators," (Springer—Verlag BerlinHeidelber, 1987.

Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).

Brotherton et al., "Influence of Melt Depth in Laser Crystallized Poly-Si Thin Film Transistors," Journal of Appl. Phys., 82:4086 (1997).

Brotherton, "Polycrystalline Silicon Thin Film Transistors," Semicond. Sci. Tech., 10:721-738 (1995).

Brotherton, S.D., et al., Characterisation of poly-Si TFTs in Directionally Solidified SLS Si, Asia Display/IDW'01, p. 387-390.

Crowder et al., "Low-Temperature Single-Crystal Si TFT's Fabricated on Si Films Processed via Sequential Lateral Solidification," IEEE Electron Device Letter, 19 (8): 306 (1998).

Crowder et al., "Parametric Investigation of SLS-processed Polysilicon Thin Films for TFT Application," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q9.7.1-9.7.6, 2000.

Dassow, R. et al. Laser-Crystallized Polycrystalline Silicon on Glass for Photovoltaic Applications, Solid State Phenomena, pp. 193-198, vols. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoernenos, P.A. Coxon, S. Friligkos, J. Antonopoulos and N.A. Economou, Effect of pressure on the growth of crystallites of low-pressure chemical-vapor-deposited polycrystalline silicon films and the effective electronmobility under high normal field in thin-film transistors, J. Appl. Phys. 73, 8402 (1993).

Endert et al., "Excimer Laser: A New Tool for Precision Micromachining," Optical and Quantum Electronics, 27:1319 (1995).

Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven," J. Electro-Chem. Soc., 129: 2812 (1982).

Gosain et al., "Formation of (100)-Textured Si Film Using an Excimer Laser on a Glass Substrate," Jpn. J. Appl. Phys., vol. 42 (2003) pp. L135-L137.

Gupta et al., "Numerical Analysis of Excimer-laser induced melting and solidification of Si Thin Films", Applied Phys. Lett., 71:99, 1997.

Hau-Riege et al., "The Effects Microstructural Transitions at Width Transitions on Interconnect reliability," Journal of Applied Physics, 87(12): 8467-8472.

Hawkins, W.G. et al., "Origin of lamellae in radiatively melted silicon films," Appl. Phys. Lett. 42(4), Feb. 15, 1983.

Hayzelden, C. and J.L. Batstone, Silicide formation and silicide-mediated crystallization of nickel-implanted amorphous silicon thin films, J. Appl. Phys. 73, 8279 (1993).

Im et al., "Controlled Super-Lateral Growth of Si Films for Microstructural Manipulation and Optimization," Phys. Stat. Sol. (a), 166:603 (1998).

Im et al., "Crystalline Si Films for Integrated Active-Matrix Liquid-Crystals Displays," MRS Bulletin, 21:39 (1996).

Im et al., "On the Super Lateral Growth Phenomenon Observed in Excimer Laser-Induced Crystallization of Thin Si Films," Appl. Phys. Lett., 64 (17): 2303 (1994).

Im et al., "Phase Transformation Mechanisms Involved in Excimer Laser Crystallization of Amorphous Silicon Films," Appl. Phys. Lett., 63 (14): 1969 (1993).

Im et al., "Single-Crystal Si Films for Thin-Film Transistor Devices," Appl. Phys. Lett., 70(25): 3434 (1997).

Im, J.S., Method and system for producing crystalline thin films with a uniform crystalline orientation, U.S. Appl. No. 60/503,419; ref. file # 36013(BB); Columbia ref. M02-063.

Ishida et al., "Ultra-shallow boxlike profiles fabricated by pulsed ultraviolet-laser doping process," J. Vac. Sci. Technol. B 12(1):399-403, (1994).

Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).

Jeon et al., "New Excimer Laser Recrystalization of Poly-Si for Effective Grain Growth and Grain Boundary Arrangement," Jpn. J. Appl. Phys. vol. 39 (2000) pp. 2012-2014, Part 1, No. 4B, Apr. 2000.

Jeon et al., "Two-step laser recrystallization of poly-Si for effective control of grain boundaries," Journal of Non Crystalline Solids, 266-269: 645-649 (2000).

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals," OE Magazine, Nov. 2001, 33-35.

Kim et al., "Grain Boundary Location-Controlled Poly-Si Films for TFT Devices Obtained Via Novel Excimer Laser Process," Mat. Res. Soc. Symp. Proc., vol. 358, 1995.

(56) References Cited

OTHER PUBLICATIONS

Kim et al., "Multiple Pulse Irradiation Effects in Excimer Laser-Induced Crystallization of Amorphous Si Films," Mat. Res. Soc. Sym. Proc., 321:665-670 (1994).
Kim, C. et al., Development of SLS-Based SOG Display, IDMC 2005, Thu-15-02, 252-255.
Kim, "Excimer-Laser-Induced Crystallization of Amorphous Silicon Thin Films," Ph. D. Dissertation Abstract, Columbia University, 1996.
Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.
Kim, H.-J., et al., "The effects of dopants on surface-energy-driven secondary grain growth in silicon films," J. Appl. Phys. 67 (2), Jan. 15, 1990.
Kim, H.J. et al., "New Excimer-laser-crystallization method for producing large-grained and grain boundary-location-controlled Si Films for Thin Film Transistors", Applied Phys. Lett., 68: 1513.
Kimura, M. and K. Egami, Influence of as-deposited film structure on (100) texture in laser-recrystallized silicon on fused quartz, Appl. Phys. Lett. 44, 420 (1984).
Knowles, D.S. et al., "P-59: Thin Beam Crystallization Method: a New Laser Annealing Tool with Lower Cost and Higher Yield for LTPS Panels," SID 00 Digest, pp. 1-3.
Kohler, J.R. et al., Large-grained polycrystalline silicon on glass by copper vapor laser annealing. Thin Solid Films, 1999, pp. 129-132, vol. 337, Elsevier.
Kung, K.T.Y. and R. Reif, Implant-dose dependence of grain size and (110) texture enhancements in polycrystalline Si films by seed selection through ion channeling, J. Appl. Phys. 59, 2422 (1986).
Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).
Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).
Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657(1994).
Lee, S.-W. and S.-K. Joo, Low temperature poly-Si thin-film transistor fabrication by metal-induced lateral crystallization, IEEE Electron Device Letters 17, 160 (1996).
Lee, S.-W., Y.-C. Jeon and S.-K. Joo, Pd induced lateral crystallization of amorphous Si thin films, Appl. Phys. Lett. 66, 1671 (1995).
Leonard, J.P. et al, "Stochastic modeling of solid nucleation in supercooled liquids", Appl. Phys. Lett. 78:22, May 28, 2001, 3454-3456.
Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.
Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.
Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on Insulator Devices, Eds. P.L.F. Hemment, Kluwer Academic Publishers 2000, pp. 55-61.
Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180(1998).
McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics,New York, US, 43(10): 946-948 (1983).
Micro/LAS Lasersystem GMBH, "Overview of Beam Delivery Systems for Excimer Lasers," (1999).
Micro/LAS Lasersystem GMBH, "UV Optics Systems for Excimer Laser Based Micromachining and Marking," (1999).
Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).
Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).
Nebel, "Laser Interference Structuring of A-SI:h" Amorphous Silicon Technology—1996, San Francisco, CA Apr. 8-12, Materials Research Society Symposium Proceedings, vol. 420, Pittsburgh, PA (1996).
Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).
Noguchi, "Appearance of Single-Crystalline Properties in Fine-Patterned Si Thin Film Transistors (TFTs) by Solid Phase Crystallization (SPC)," Jpn. J. Appl. Phys., 32:L 1584-L1587 (1993).
Ozawa et al., "Two-Dimensionally Position-Controlled Excimer-Laser-Crystallization of Silicon Thin Films on Glassy Substrate," Jpn. J. Appl. Phys. 38(10):5700-5705 (1999).
Sato et al., "Mobility anisotropy of electrons in inversion layers on oxidized silicon surfaces," Physical Review B (State) 4, 1950 (1971).
Smith, H.I. et al, "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.
Song et al., "Single Crystal Si Islands on SiO2 Obtained Via Excimer Laser Irradiation of a Patterned Si Film", Applied Phys. Lett., 68:3165, 1996.
Sposili et al., "Line-scan sequential lateral solidification of Si thin films", Appl. Phys. A67, 273-6, 1998.
Sposili et al., "Sequential Lateral Solidification of Thin Silicon Films on SiO2," Appl. Phys. Lett., 69(19): 2864 (1996).
Sposili et al., "Single-Crystal Si Films via a Low-Substrate-Temperature Excimer-Laser Crystallization Method," Mat. Res. Soc. Symp. Proc., 452: 953-958 (1997).
Thompson, C.V. and H.I. Smith, Surface-energy-driven secondary grain growth in ultrathin (<100 nm) films of silicon, Appl. Phys. Lett. 44, 603 (1984).
van der Wilt, P.C. et al., "State-of-the-Art Laser Crystallization of Si for Flat Panel Displays," PhAST, May 18, 2004, pp. 1-34.
van der Wilt, P.C. et al., "The Commercialization of the SLS Technology," Taiwan FPD, Jun. 11, 2004, pp. 1-12.
van der Wilt, P.C., "Textured poly-Si films for hybrid SLS," Jul. 2004, pp. 1-5.
Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.
Voutsas, A.T. et al.: "Effect of process parameters on the structural characteristics of laterally grown, laser-annealed polycrystalline silicon films," Journal of applicaed Physics, vol. 94, No. 12, Dec. 15, 2003.
Voutsas, A.T., A new era of crystallization: advances in polysilicon crystallization and crystal engineering, Applied Surface Science 250-262, 2003.
Watanabe et al., "Crystallization Process of Polycrystalline Silicon by KrF Excimer Laser Annealing," Japanese J. of Applied Physics, Part 1—Regular Papers Short Notes & Review Papers, 33:4491-98 (1994).
Weiner, K. H. et al. "Laser-assisted, Self-aligned Silicide Formation," A Verdant Technologies technical brief, Aug. 7, 1997, 1-9.
Weiner, K. H. et al., "Ultrashallow Junction Formation Using Projection Gas Immersion Laser Doping (PGILD)," A Verdant Technologies Technical Brief, Aug. 20, 1997.

(56) References Cited

OTHER PUBLICATIONS

Werner, J.H., et al. From polycrystalline to single crystalline silicon on glass, Thin Solid Films 383, 95-100, 2001.
White et al., "Characterization of thin-oxide MNOS memory transistors," IEEE Trans. Electron Devices ED-19, 1280 (1972).
Yamamuchi et al., "Polycrystalline silicon thin films processed with silicon ion implantation and subsequent solid-phase crystallization: Theory, experiments, and thin-film transistor applications" Journal of Applied Physics, 75(7):3235-3257 (1994).
Yoshimoto et al., "Excimer-Laser-Produced and Two-Dimensionally Position-Controlled Giant Si Grains on Organic SOG Underlayer," p. 285-286, AM-LCD (2000).
International Search Report for corresponding International Patent Application No. PCT/US2010/033565, mailed Jul. 1, 2010, 1 page.
International Search Report for corresponding International Patent Application No. PCT/US2010/055106, mailed Jan. 4, 2011, 1 page.
Andrä et al., "A new technology for crystalline silicon thin film solar cells on glass based on the laser crystallization," IEEE, pp. 217-220 (2000).
Andrä et al., "Multicrystalline LLC-SI thin film solar cells on low temperature glass," Poster, 3rd world Conference on Photovoltaic Energy Conversion, Osaka, Japan, pp. 1174-1177, May 11-18, 2003.
Sinke et al., "Explosive crystallization of amorphous silicon: Triggering and propagation," Applied Surface Science, vol. 43, pp. 128-135 (1989).
Van Der Wilt, "A hybrid approach for obtaining orientation-controlled single-crystal Si regions on glass substrates," Proc. of SPIE vol. 6106, 61060B-1 to B-15, (2006).

\* cited by examiner

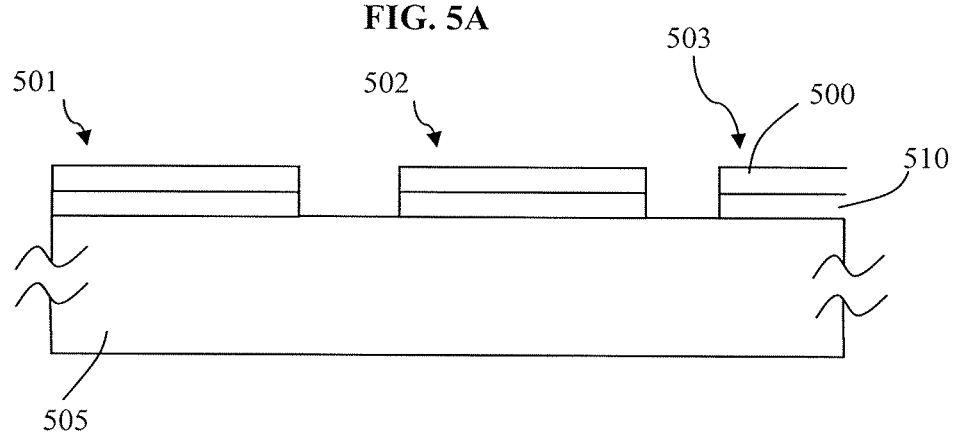
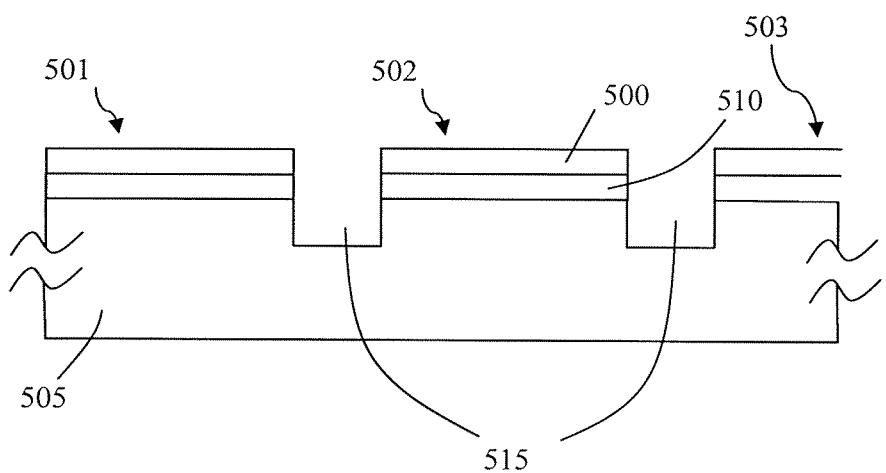

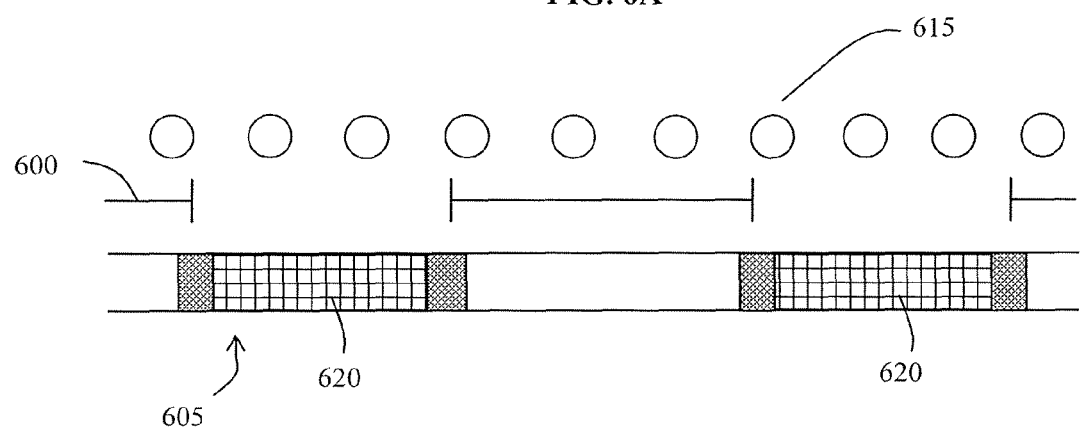
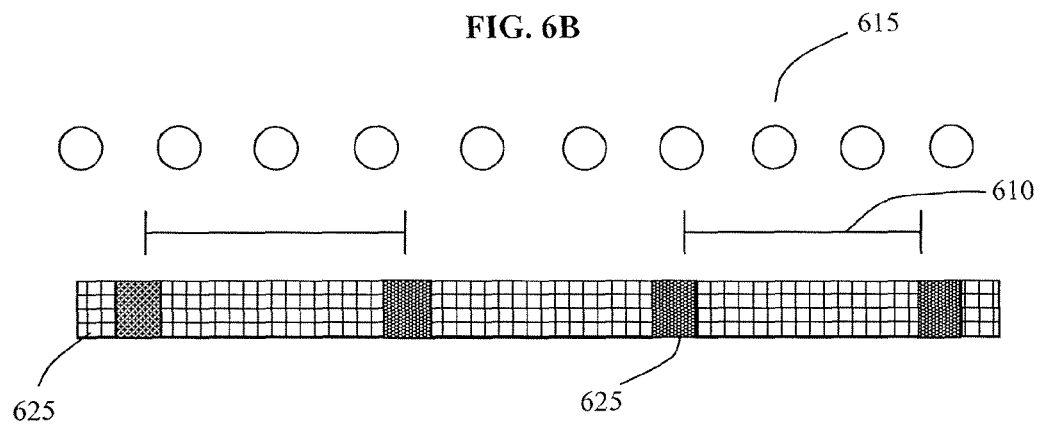

FLASH LAMP ANNEALING CRYSTALLIZATION FOR LARGE AREA THIN FILMS

CROSS-REFERENCE TO RELATED APPLICATION

This application is a U.S. national phase application under 35 U.S.C. §371 of International Patent Application No. PCT/US2009/035566, filed Feb. 27, 2009, entitled "Flash Lamp Annealing Crystallization for Large Area Thin Films," which claims the benefit under 35 U.S.C. §119(e) of U.S. Provisional Application No. 61/032,737, filed Feb. 29, 2008, entitled "Flash Lamp Annealing Lateral Growth," and U.S. Provisional Application No. 61/032,784, filed Feb. 29, 2008, entitled Flash Lamp Annealing on Glass," the entirety of each of the disclosures of which are explicitly incorporated by references herein.

FIELD

The disclosed subject matter generally relates to crystallization of large area thin films and particularly relates to utilizing flash lamp annealing in combination with patterning techniques in making thin film devices.

BACKGROUND

Flash lamp annealing (FLA) of thin silicon films can be used as a low-cost alternative to laser crystallization. Such films, for example, may be used in producing different devices, including thin film transistors (TFTs). The flash lamp pulse durations may be as short as 10 µs or as long as 10 ms.

However, FLA provides limited control over the nature and the location of the grain boundaries in the crystallized thin film. This limitation can pose problems for creating uniform transistors. FLA also may result in a material with a high volume of defects resulting from long lateral explosive crystallization. Therefore, materials produced by FLA may have lower performance levels than materials produced from other methods, including Sequential Lateral Solidification (SLS) and Excimer Laser Annealing (ELA). ELA crystallized thin films with an excimer laser. However, such laser source is not only expensive to purchase but also expensive to use, largely because of the laser tube replacements that are required. Conversely, FLA may provide uniform materials at a low cost and high-throughput, and scalable to large area thin films.

SLS and ELA crystallization techniques are limited by the length of the line beam in both applications. For example, for large area thin films, e.g., thin films having a length greater than 1.3 meters and a width greater than 1.5 (for example, Gen-5 (1.3 m×1.5 m), Gen-6 (1.5 m×1.8 m) or Gen-8 (2.2 m×2.5 m) thin film panels) the SLS or ELA line beam can not provide uniform beam properties over the entire width or length of the large area thin film. Thus, the SLS or ELA scan is performed in small sections of the film area, requiring panel movement in both the x and y directions to successfully process the film. Not only does scanning in both the x and y directions increase the duration of the process, but it also produces lesser quality films with beam edges and non-uniformities between crystallization scans, than scanning a smaller film would produce.

SUMMARY

This application describes methods and systems for utilizing flash lamp annealing (FLA) in combination with patterning techniques to crystallize large area thin films on glass substrates or other substrates that have low tolerance for high temperatures. Some embodiments use a shielding layer to shield areas of the substrate from exposure to the flash lamp. In other embodiments, proximity masks may be used to expose areas that exactly match the size of one or multiple devices. In yet other embodiments, barriers are etched into the film, and even the underlying layer, to control heat transfer from one area to the next. In certain embodiments, the film is covered with a patterned capping layer before being irradiated. The film in the uncovered region is melted and the crystallographic lateral growth will proceed from the edges between the covered and uncovered regions. In another approach, melt-mediated explosive crystallization is used between the covered and uncovered regions.

In one embodiment, a method of irradiating a large area film with a pulsed light source includes providing a large area film on a substrate, covering at least a portion of the large area film with a covering material, wherein the covering material has one or more exposure areas that expose one or more sections of the film, irradiating the film and covering material with a pulsed light source under conditions to at least partially melt a portion of the film, wherein the irradiation area has a dimension at least substantially equal to a dimension of the film and the irradiating of the film causes crystallization to proceed from the interface between the exposed sections and the non-exposed sections of the film.

In one or more embodiments, the large area film has a length of greater than 1.3 meters and a width of greater than 1.5 meters or a length of greater than 1.5 meters and a width of greater than 1.8 meters. In some embodiments, one dimension of the irradiation area is greater than about 1.3 meters.

In one or more embodiments, the covering layer comprises a capping layer.

In one or more embodiment, the capping layer is deposited on the film, is a film, is at least one of absorptive and reflective, is metallic, and/or is opaque to the pulsed light source.

In one or more embodiments, the energy density of the FLA radiation is selected to induce at least one of lateral growth and explosive crystallization in the film.

In one or more embodiments, the pulsed light source is a flash lamp.

In one or more embodiments, the method includes providing an absorber layer between the film and the substrate, wherein the absorber layer absorbs the pulsed light source irradiation and the absorber layer can be metallic.

In one or more embodiments, the substrate is glass.

In one or more embodiments, the method includes removing a portion of the film prior to covering the film and/or removing a portion of the substrate below the portion of removed film.

In one or more embodiments, the method the film comprises a plurality of single crystal island segments.

In one or more embodiments, the method the covering comprises a proximity mask, wherein the proximity mask is located at a first position and covers only a first portion of the film and/or the proximity mask is opaque to the pulsed light source.

In one or more embodiments, the method includes moving the proximity mask to a second position, said second position covering a second portion of the film.

In one or more embodiments, the second portion of the film does not overlap the first portion of the film or the first section and the second section partially overlap.

In one or more embodiments, the method includes moving the mask comprises placing a second mask having a different configuration of openings over the film.

In one embodiment, a method of irradiating a large area film using a pulsed light source includes providing a large area film having a first dimension and a second dimension on a substrate, covering the film with a capping layer having a pattern, wherein the pattern exposes one or more sections of the film, irradiating the film with a pulsed light source under conditions to at least partially melt a first portion of the film while a second portion of the film remains solid, wherein the irradiation area has a dimension at least substantially equal to a dimension of the film, and re-solidifying the first portion of the film to form a crystalline portion thereby releasing heat to melt an adjacent portion of the film.

BRIEF DESCRIPTION OF DRAWINGS

FIGS. 5A and 5B are schematics of a thin film crystallization system implementing heat flow isolation, according to some embodiments of the disclosed subject matter.

FIG. 6A is a schematic of a thin film crystallization system implementing proximity masks, according to some embodiments of the disclosed subject matter.

FIG. 6B is a schematic of a thin film crystallization system implementing proximity masks, according to some embodiments of the disclosed subject matter.

DETAILED DESCRIPTION

The present application describes a general approach for applying the FLA process to obtain an ordered microstructure on large area thin films useful for device applications, such as active matrix liquid crystal displays (AMLCDs) or active matrix organic light emitting diode displays (AMOLEDs). Large area thin films, as discussed herein, refer to thin films having a length greater than 1.3 meters and a width greater than 1.5 meters. For example, large area thin films can be Gen 5.5 (1.3 m×1.5 m or 1.32 m×1.5 m), Gen 6 (1.5 m×1.8 m or 1.5 m×1.85 m), Gen 7 (1.87.×2.2 m or 1.95 m×2.25 m), Gen 8 (2.16 m×2.46 m or 2.2 m×2.5 m), Gen 9 (2.2 m×2.6 m or 2.4 m×2.8 m), or Gen 10 (2.6 m×3.1 m) thin film panels. Several techniques of pulsed-radiation crystallization of thin films and lithography-based controlled super-lateral growth (C-SLG) are explained and utilized. Masking layers, lithography or other patterning techniques are used to create patterns, such as patterned cap layers, patterned silicon films, patterned underlayers, heat sinks, surface morphology, and thickness variations. These layers and structures are used to locally adjust the melting thresholds of the thin film. It will be apparent from the description that follows that the method is not limited to silicon thin film crystallization and may be practiced for any thin film. For the purposes of discussion that follows, unless specifically noted the methods may be used for any such material. It also will be apparent from the description that follows that other pulsed light sources may be used, so long as they also provide a pulsed divergent light source or a pulsed flood light and the desired control of the mixed phase partial melting process. Unless explicitly stated, flash lamp annealing or "FLA" is also meant to include diode lasers and other divergent pulsed light sources used as a "flash lamp."

However, the use of FLA techniques on glass substrates may introduce new challenges compared to the previous techniques. The pulse duration for FLA pulses can range from about 10 μs to about 10 ms or even longer. The upper boundary of the FLA pulse duration is considerably larger than the pulse durations in the commonly used pulsed-laser approaches, for which typical pulse durations vary from about ~30 ns to about 300 ns. As a result, the heat diffusion length (SQRT(Dt)) is considerably larger for FLA. Thus, higher pulse energies are required to reach the desired degree of melting in the silicon film. This excess heat can lead to a higher degree of heating in the underlying substrate and therefore can result in melting or distortion of a glass substrate, if used. Therefore, it may be more challenging to implement FLA for films on glass or other high-temperature-intolerant substrates.

Figure 1:
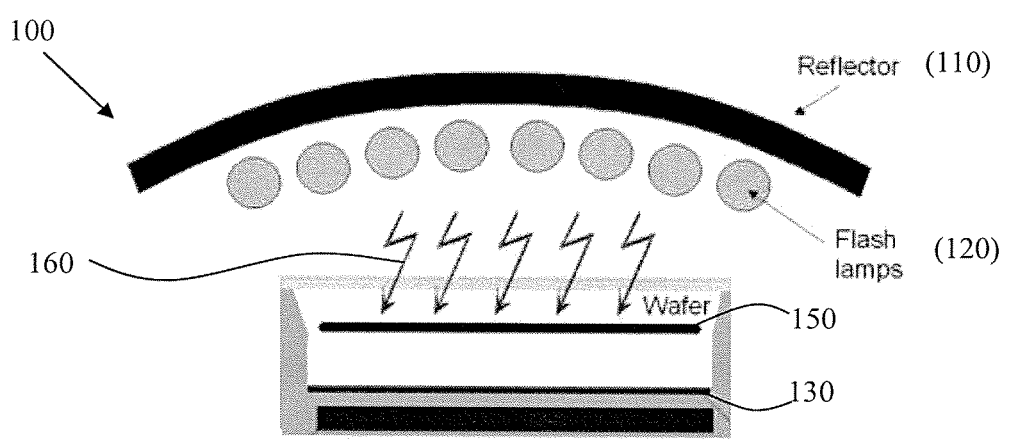
FIG. 1 is a schematic illustration of a flash lamp apparatus that may be used, according to some embodiments of the disclosed subject matter.

Flash laser annealing uses a flash lamp to produce white light over a wide wavelength range, e.g., 400-800 nm. The flash lamp is a gas-filled discharging lamp that produces intense, incoherent full-spectrum white light for very short durations. A flash lamp annealing apparatus uses white light energy for surface irradiation, in which the light is focused using, for example, an elliptical reflector to direct the light energy onto a substrate, such as is shown in FIG. 1. FIG. 1 is a simplified side view diagram representing a flash lamp reactor 100 with a reflecting device 110, in accordance with an embodiment of the present invention. The flash lamp reactor may include an array of flash lamps 120 located above a support 130, with a target area 150 situated between the two. The reflecting device 110 may be positioned above the flash lamps to reflect varying amount of radiation 160 from the flash lamps back towards different portions of a facing side of the target area. The target area may be adapted to receive a substrate (wafer).

The lamp power is supplied by a series of capacitors and inductors (not shown) that allow the formation of well defined flash pulses on a microsecond to millisecond scale. In a typical flash lamp, light energy densities in the range of up to 3-5 J/cm$^2$ (for a 50 μs discharge) or 50-60 J/cm$^2$ for a 1-20 ms discharge can be obtained. In exemplary embodiments, the light energy density can be about 2-150 J/cm$^2$. Flash lamp annealing allows fast heating of solid surfaces with a single light flash between some tens microseconds and some tens milliseconds, e.g., 10 μs-100 ms. Variables of the flash lamp that affect the quality of thin film crystallization include the energy intensity of the incident light, as well as the pulse duration and shape of the light (which results in a certain dwell time, i.e., a duration of melting).

Because flash lamp irradiation is a flood irradiation process, the flash lamps can irradiate large areas of the substrate surface in a single pulse. It is possible that the entire film on a substrate, for example a glass panel, can be processed simultaneously. Thus, multi-pulse operations in a scanned fashion to cover a large substrate area, for example, as used in laser-based recrystallization, are not required.

Figure 2A:
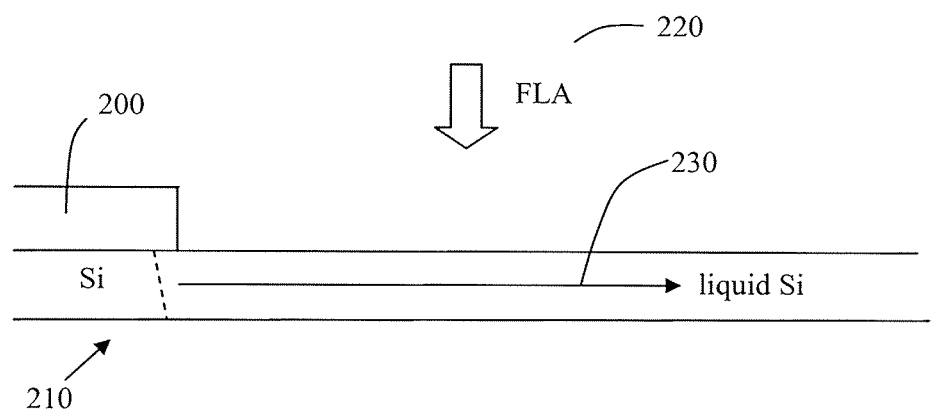
FIG. 2A is a schematic of a thin film crystallization system implementing utilizing FLA and patterned capping layer for lateral growth, according to some embodiments of the disclosed subject matter.

In one approach for processing large area thin films, shown in FIG. 2A, a patterned capping layer 200 that is reflective, absorptive, or both, is provided on top of a thin film 210. The capping layer 200 can be a continuous film with a plurality of openings. The capping layer 210 can be substantially opaque to the irradiated light or reflective. The capping layer 210 can be a proximity mask or a deposited layer, for example, by using a lithography technique. Lithography techniques in FLA processing of thin films is disclosed in co-pending, PCT Serial No. PCT/US09/35732, entitled "Lithographic Method of Making Uniform Crystalline Si-Films," which is hereby incorporated by reference in its entirety. If the capping layer is reflective, it can be composed of any reflective material, for example, a metallic material, such as, e.g., aluminum. It may be desired to place a thin barrier layer such as, e.g., $SiO_2$ between the metallic cap layer and the film to prevent metal diffusion.

In one embodiment, the film 210 is irradiated by using a flash lamp 220 at an energy density sufficient to melt the uncovered film but insufficient to completely melt the covered portion of the film. In this embodiment, lateral growth 230 of the crystalline structure will initiate at the edges between the covered and uncovered regions and propagate along arrow 230 to produce a crystalline material. Generally, Si grains tend to grow laterally from or perpendicular to interfaces between the liquid phase and solid phase silicon. Thus, when sections of the film 210 are irradiated and melted while other sections of the film 210 remain solid, the crystalline growth starts from the solid/liquid interface of the film 210 along arrow 230 and proceeds laterally along the film 210. This form of crystalline growth is called lateral growth. Lateral crystalline growth can produce large Si grains that can be used for device manufacture. Thus, devices can be made in the laterally grown regions of the thin film 210, i.e., the regions of the crystalline material in which the crystalline structure was formed as a result of lateral growth.

In yet another embodiment, the system can have one or more underlying absorber layers that can absorb the longer wavelength radiation, for example, longer than 600 nm, from the flash lamps. These absorber layers can be positioned between the thin film and the substrate or below the substrate. Because they preferentially absorb the longer wavelength radiation, the absorber layer will heat up first and can transfer the thermal energy from the radiation to the film to induce melting, while other regions in the film are heated by shorter wavelength light only and may remain solid. Because the flash lamps provide broad spectrum light, this arrangement provides the most efficient capture of the full energy spectrum of the flash lamp radiation and also can permit the capture of radiation that is transparent to the Si. These absorbing layers can be composed of any heat absorbing material, for example a metallic substance, such as molybdenum.

In embodiments having the absorber layer, the silicon film can be irradiated from the top portion of the film. The flash lamp radiation irradiates the top portion of the film and penetrates through the thickness of the film to the absorber layer. In some instances, the majority of the light is absorbed by the absorber layer. This absorption heats the absorber layer, thus providing heat to the silicon film from the bottom and thus melting the thin film. Thus, the above embodiment offers ways of accurately defining the location of regions of lateral growth using a non-patterned light source.

Figure 2B:
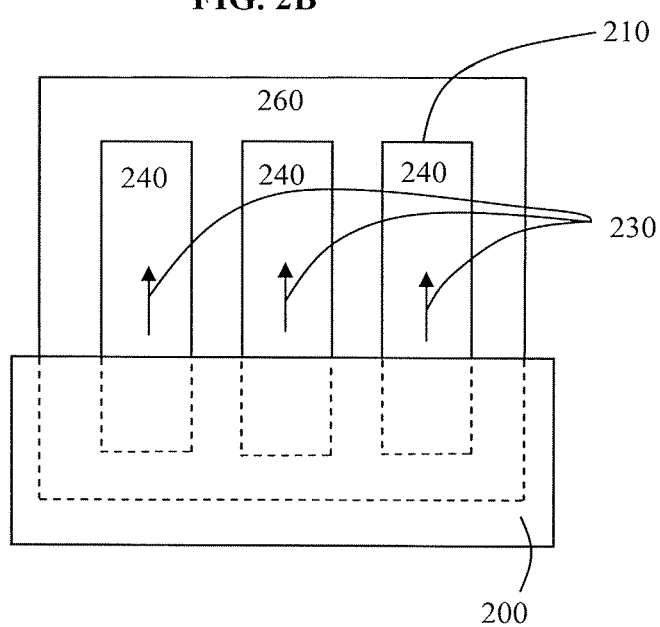
FIG. 2B is a top view of the lateral growth in the capped film, according to some embodiments of the disclosed subject matter.
Figure 2C:
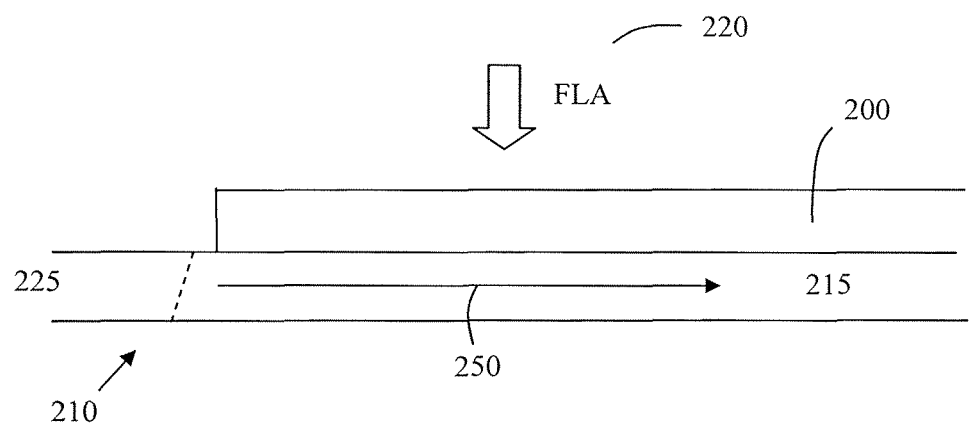
FIG. 2C is a schematic of a thin film crystallization system implementing FLA and patterned capping layer for explosive crystallization, according to some embodiments of the disclosed subject matter.

In another approach, shown in FIG. 2C, a similar configuration of thin film 210 and cap layer 200 is used. However, the energy density of the flash lamp 220 is selected such that the covered portion film remains amorphous, while the uncovered portion of the film is at least partially molten. This situation triggers melt-mediated explosive crystallization 250. As the first section melted portion reforms as crystalline silicon, an exotherm is created by the energy being dissipated as heat from the silicon as the silicon forms a more thermodynamically stable crystalline form. As the amorphous material melts in the presence of the crystalline material, but the temperature of the liquid is still below the melting point of the crystalline material, the crystallizing materials will grow epitaxially. That exotherm is sufficient to melt adjacent amorphous silicon which itself then re-crystallizes as crystalline silicon and releases an additional amount of energy. An exotherm, therefore, propagates as a wave through the material from the region closest to amorphous/front and propagates throughout the amorphous section of the thin film, in the direction of the arrow 250.

Generally, the explosive crystallization process will continue until quenched or until all the amorphous material is transformed into crystalline material. Quenching is known to result in lowering of the temperature at the growth front and formation of defects and ultimately of halting of the process. Quenching is often the result of nearby conductive materials and/or nearby substrates.

The flash lamp annealing conditions are selected such that the explosive crystallization can continue laterally for a sufficient distance through the thin film. The heat generated at the crystallization front by explosive crystallization can result in (1) further melting of the amorphous Si in region 215, (2) diffusive heat loss into the a-Si in region 225 (which will can be used for heating of the a-Si towards the melting point), and (3) diffusive heat loss into the substrate. The further melting of the amorphous Si is what drives the explosive nature of the process, because it requires less heat than what is generated by the explosive crystallization process. If heat absorption to the substrate or a-Si region 225 becomes too large, then insufficient heat will be available to drive further melting of the a-Si, leading to quenching of the process. Therefore, pre-heating the a-Si and/or pre-heating the substrate can increase the explosive crystallization distance by reducing diffusive heat loss. Pre-heating mechanisms include use of a heated substrate, such as a hot plate and co-irradiation, in which one radiation is used for heating and a second irradiation is used for preheating. For example, the flash lamp energy can be such that the amorphous region is substantially heated by the beam, but not to the point that crystallization occurs. The heat deposited in the amorphous film permits the explosive crystallization process to proceed over a longer distance. Further, the absorber layer used in the lateral growth embodiments also can be used to induce explosive crystallization by heating the sections of a-Si and extending the explosive crystallization growth length.

Compared with lateral growth from the melt as shown in FIG. 2A, the irradiation used for triggered explosive crystallization may have a lower energy density. This is because lateral growth requires complete melting of the thin film, while explosive crystallization only requires at a minimum some partial melting. Conversely, for explosive crystallization only some melting needs to be triggered before the crystallization process proceeds. Therefore, because explosive crystallization can be triggered with only partial melting of the silicon, explosive crystallization can occur at lower temperature than lateral growth crystallization. Thus, because of the lower temperature, explosive crystallization techniques may be better suited to thin films on glass substrates.

However, in the explosive crystallization embodiment, the pattern of the capping layer on the film can be different from the capping layer pattern used for lateral growth. For example, when using reflective capping layers to prevent the thin film from melting, rectangular areas of the capping layer should cover the film where lateral explosive crystallization is desired. However, the remainder of the film need not be entirely uncovered. In principle, it is enough to have just a narrow trench in the capping layer adjacent to the region where explosive crystallization is sought.

Figure 2D:
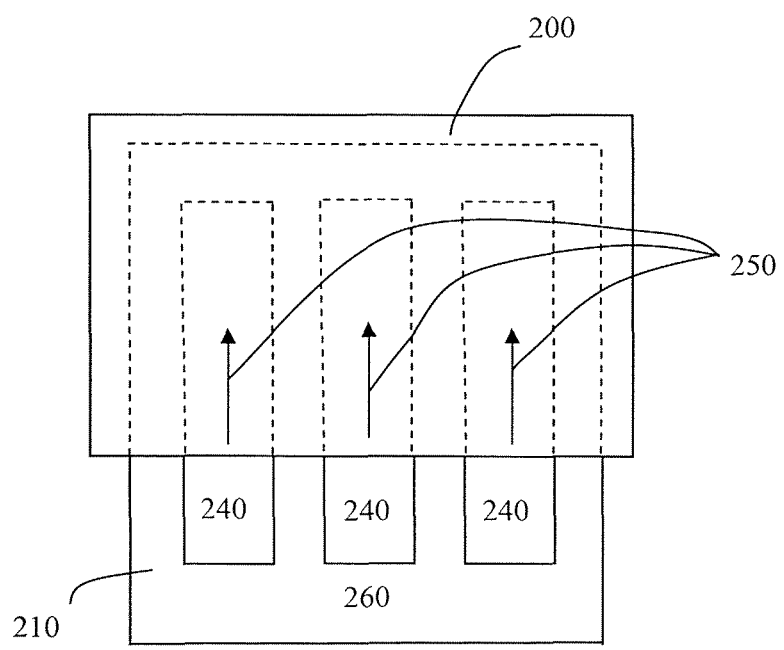
FIG. 2D is a top view of explosive crystallization in the capped film, according to some embodiments of the disclosed subject matter.

The above approaches also can be combined with the patterning of the silicon islands. The patterning of silicon islands is disclosed in co-pending PCT Application Serial No. PCT/US08/077199, filed on Sep. 22, 2008, entitled "Collections of Laterally Crystallized Semiconductor Islands for Use in Thin Film Transistors and Systems and Methods for Making Same," the entire disclosure of which is incorporated by reference. The patterning of silicon islands can be used to create high quality TFTs by reducing the length of similarly oriented domains in a long laterally grown material, which can reduce intragrain defects. These oriented domains in the crystalline structure may lead to device non-uniformity when they are of a size comparable or larger than the size of the devices, and when there are different types of oriented domains that can co-exist, as may result from SLS or even a single-pulse process. In general, oriented domains can be created as a result of occlusion in lateral growth. FIGS. 2B and 2D show lateral growth 230 and explosive crystallization 250, respectively, in a plurality of striped patterned crystal islands 240 contained within a substrate 260. With the very long lateral growth distances, even in a single pulse, oriented domains may form that are too large for device manufacturing.

Figure 3:
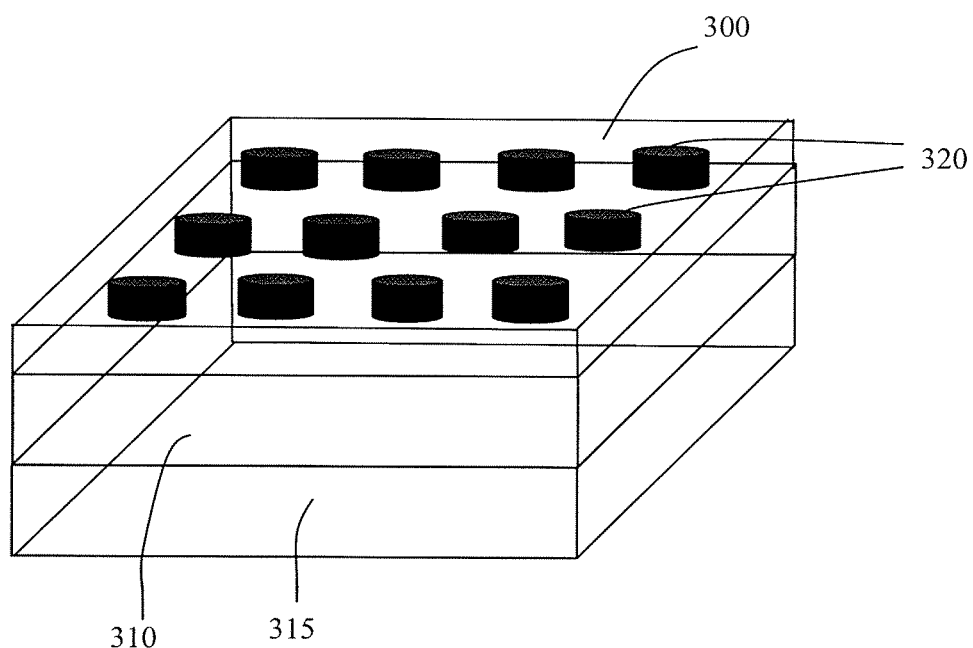
FIG. 3 is a schematic of a thin film crystallization system implementing shielding layers, according to some embodiments of the disclosed subject matter.

In another aspect, the present application pertains to increasing the compatibility of the FLA process with films on glass substrates. In some embodiments, as shown in FIG. 3, a shielding layer 300 (e.g., a layer that is reflective or absorptive or both reflective and absorptive) is deposited on the film 310, which rests on a substrate 315, and openings 320 are etched in the shielding layer 300 corresponding to regions in the film 320 where TFT channel regions will be fabricated. This method can be used for pixel TFTs where the density of the devices is relatively low. As a result, the substrate 315, and the thin film 310 which may be patterned and/or composed of silicon, will be largely shielded from the beam. The small pockets of heating may lead to local "over-heating" of the substrate 315, but the resultant stresses will be localized and therefore less harmful to the substrate 315.

Figure 4:
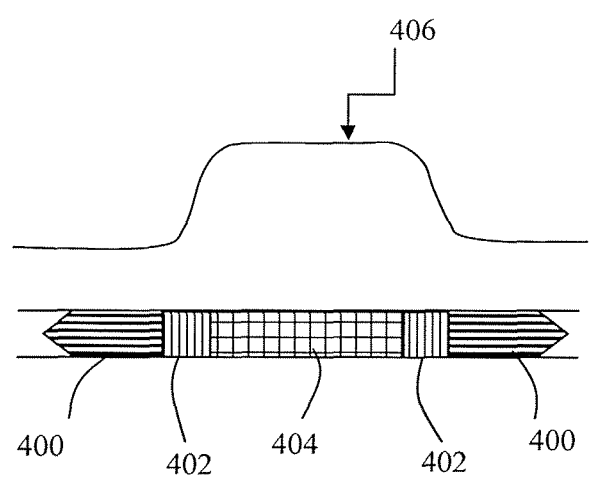
FIG. 4 sketches examples of the effect of lateral heat diffusion.

Furthermore, as shown in FIG. 4, because of the increased heat diffusion in the lateral direction, it may also be more challenging to crystallize well-defined regions in the film without considerable "smearing" of the crystallized region by lateral crystallization away from the irradiated region, which includes a large grain region 404 and a narrow small grain region 402 at the edge of the irradiated region. The cut-off or transition between crystallized and amorphous Si is "smeared" because of the formation of an extended region crystallized via explosive crystallization 400, as brought about by the long heat diffusion length effects addressed above. In addition, some smearing also may result from fluence gradients, which are non-sharp transitions between light and dark regions that may exist at the edges of radiation beams, as shown in the beam profile 406 in FIG. 4, as a result of poor projection properties of the light or even the absence of such optics. This leads to an increased degree of smearing. In sum, wide edge regions may exist in which non-uniform microstructures can be created. These regions will have different optical properties from the surrounding amorphous regions and will likely have a different melting threshold, making subsequent processing more difficult. As a result, closely-spaced radiations of the film in order to fully crystallize with minimized edge regions may not be possible. Therefore, a full irradiation of the film would be preferred.

Therefore, in some embodiments, for example, shown in FIGS. 5A and 5B, the unwanted lateral crystallization can be reduced by providing barriers for lateral heat flow at the edges of the radiated region of a thin film 500 on a substrate 505. The barriers or isolation of the film can be provided by etching the thin film 500 or by also etching the underlying layers, for example, a buffer layer 510 (as shown in FIG. 5A). The etching of the thin film can reduce irradiation heat transfer between a first section 501, a second section 502 and a third section 503. However, some heat may be transferred through the substrate. Therefore, as shown in FIG. 5B, the substrate 505 can have one or more trenches 515. These trenches 515 can further reduce heat flow between the first section 501, the second section 502 and the third sections 503, thereby further limiting unwanted lateral crystallization. Such trenches 515 can be made using conventional etching techniques or even laser scribing techniques.

This embodiment can prevent non-sharp/smeared crystallized domains, as shown in FIG. 4. In other embodiments, because of long heat diffusion length, wide edges that are non-uniformly crystallized can form, which may prevent close tiling. For example, once a region is crystallized via explosive crystallization, the optimum energy to induce mixed phase solidification, as described in co-pending, PCT Application Serial No. PCT/US09/35537, filed on even date herewith, titled "Flash Light Annealing for Thin Films," has shifted and a next radiation may thus not lead to MPS in those explosive crystallization regions. The process shown in FIG. 5 allows for more sharply defined crystallized regions and can alleviate these problems. In some embodiments, this approach can be combined with the other embodiments disclosed herein, including the use of capping layers, underlying absorbing films, and/or proximity masks.

In other embodiments, for example shown in FIGS. 6A and 6B, the effect of the edge regions as shown in FIG. 4 in subsequently made devices, e.g., displays, can be reduced by using proximity masks 600. As shown in FIG. 6A a proximity mask 600 may be used to expose areas 620 of the thin film 605 to the FLA radiation produced by the flash lamps 615 that exactly match the size of one or multiple display(s) or other device(s) or are relatively close in size to such displays or devices. One or multiple radiations may be performed with the proximity mask. The proximity mask 600 should be composed of a material that is substantially opaque to the incident light. Exemplary mask materials include, but are not limited to, metallic substrates. Subsequently, as shown in FIG. 6B, the proximity mask may be moved or replaced by second proximity mask 610 to irradiate other regions 625 corresponding to one or more displays or devices. This process may be repeated several times until the location of all devices on the panel have been irradiated. In typical embodiments, as few as two iterations may be sufficient. In some embodiments, the mask can be different from the capping layer discussed above. The flash lamp uses divergent light, therefore, it does not lend itself well for overlapped radiation that leads to extended lateral growth. Rather, the entire film is radiated (or large regions thereof). The proximity mask divides the film into sections to limit the heating of the substrate on any given pulse. Thus, the surface of the film is being tiled. However, some overlapping radiations can result in continuous microstructure, but more likely that is not the case, and, for example, some lateral growth may occur on the edges. In that case, care must be taken to not make devices from those edge regions. This can be possible using alignment techniques.

Upon review of the description and embodiments of the present invention, those skilled in the art will understand that modifications and equivalent substitutions may be performed in carrying out the invention without departing from the essence of the invention. Thus, the invention is not meant to be limiting by the embodiments described explicitly above, and is limited only by the claims which follow. Further, the features of the disclosed embodiments can be combined, rearranged, etc. within the scope of the invention to produce additional embodiments.

What is claimed is:

1. A method of irradiating a large area film with a pulsed light source comprising:
    providing a large area film, having a first dimension and a second dimension, on a substrate;
    covering at least a portion of the large area film with a covering material, wherein the covering material has one or more exposure areas that expose one or more sections of the large area film; and
    irradiating the large area film and covering material with a pulsed light source under conditions to at least partially melt a portion of the large area film, wherein the irradiation area has a dimension at least substantially equal to a dimension of the large area film and the irradiating of the film causes crystallization to proceed from the interface between the exposed sections and the nonexposed sections of the large area film.

2. The method of claim 1, wherein the large area film has a length of greater than 1.3 meters and a width of greater than 1.5 meters.

3. The method of claim 1, wherein the large area film has a length of greater than 1.5 meters and a width of greater than 1.8 meters.

4. The method of claim 1, wherein one dimension of the irradiation area is greater than 1.3 meters.

5. The method of claim 1, wherein the covering layer comprises a capping layer.

6. The method of claim 4, wherein the capping layer is deposited on the large area film.

7. The method of claim 4, wherein the capping layer comprises a film.

8. The method of claim 4, wherein the capping layer is at least one of absorptive, reflective, and opaque to the pulsed light source.

9. The method of claim 8, wherein the capping layer is metallic.

10. The method of claim 1, wherein the energy density of the FLA radiation is selected to induce at least one of lateral growth and explosive crystallization in the large area film.

11. The method of claim 1, wherein the pulsed light source is a flash lamp.

12. The method of claim 1, further comprising providing an absorber layer between the large area film and the substrate, wherein the absorber layer absorbs the pulsed light source irradiation.

13. The method of claim 12, wherein the absorber layer is metallic.

14. The method of claim 1, wherein the substrate is glass.

15. The method of claim 1, further comprising removing a portion of the large area film prior to covering the large area film.

16. The method of claim 15, further comprising removing a portion of the substrate below the portion of removed large area film.

17. The method of claim 1, wherein the large area film comprises a plurality of single crystal island segments.

18. The method of claim 1, wherein the covering comprises a proximity mask, wherein the proximity mask is located at a first position and covers only a first portion of the large area film.

19. The method of claim 18, wherein the proximity mask is opaque to the pulsed light source.

20. The method of claim 18, further comprising:
    moving the proximity mask to a second position, said second position covering a second portion of the large area film.

21. The method of claim 18, wherein the second portion of the large area film does not overlap the first portion of the large area film.

22. The method of claim 18, wherein the first section and the second section partially overlap.

23. The method of claim 18, wherein moving the mask comprises placing a second mask having a different configuration of openings over the large area film.

24. A method of irradiating a large area film using a pulsed light source comprising:
    providing a large area film, having a first dimension and a second dimension, on a substrate;
    covering the large area film with a capping layer having a pattern, wherein the pattern exposes one or more sections of the large area film;
    irradiating the large area film with a pulsed light source under conditions to at least partially melt a first portion of the large area film while a second portion of the large area film remains solid, wherein the irradiation area has a dimension at least substantially equal to a dimension of the large area film; and
    re-solidifying the first portion of the large area film to form a crystalline portion thereby releasing heat to melt an adjacent portion of the large area film.

* * * * *

UNITED STATES PATENT AND TRADEMARK OFFICE
CERTIFICATE OF CORRECTION

| | | |
|---|---|---|
| PATENT NO. | : | 8,569,155 B2 |
| APPLICATION NO. | : | 12/919681 |
| DATED | : | October 29, 2013 |
| INVENTOR(S) | : | James S. Im |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 371 days.

Signed and Sealed this
Fifteenth Day of September, 2015

Michelle K. Lee
*Director of the United States Patent and Trademark Office*